(12) United States Patent
Gandhi

(10) Patent No.: US 8,265,196 B2
(45) Date of Patent: Sep. 11, 2012

(54) NOISE INJECTION CIRCUIT AND METHOD FOR SIGNAL PROCESSING

(75) Inventor: Hardik Prakash Gandhi, Mountain View, CA (US)

(73) Assignee: Texas Instruments Incorporated, Dallas, TX (US)

( * ) Notice: Subject to any disclaimer, the term of this patent is extended or adjusted under 35 U.S.C. 154(b) by 817 days.

(21) Appl. No.: 12/342,310

(22) Filed: Dec. 23, 2008

(65) Prior Publication Data

US 2010/0158166 A1   Jun. 24, 2010

(51) Int. Cl.
*H04K 1/02* (2006.01)

(52) U.S. Cl. ..... 375/296; 375/295; 375/297; 455/67.13; 455/114.2; 455/114.3; 455/126

(58) Field of Classification Search .......... 375/295–297; 455/67.13, 114.2, 114.3, 126
See application file for complete search history.

(56) References Cited

U.S. PATENT DOCUMENTS

| | | | |
|---|---|---|---|
| 6,781,951 B1 | 8/2004 | Fifield | |
| 7,013,161 B2 * | 3/2006 | Morris | 455/522 |
| 7,061,990 B2 * | 6/2006 | Wright et al. | 375/296 |
| 7,095,798 B2 * | 8/2006 | Hunton | 375/296 |
| 7,110,445 B2 * | 9/2006 | Melsa | 375/224 |
| 7,453,954 B2 | 11/2008 | Wright et al. | |
| 7,634,024 B2 * | 12/2009 | Tan | 375/297 |
| 7,697,591 B2 * | 4/2010 | Copeland | 375/130 |
| 7,839,949 B2 * | 11/2010 | Hamada et al. | 375/296 |
| 2004/0052314 A1 | 3/2004 | Copeland | |
| 2006/0029158 A1 * | 2/2006 | Lipka et al. | 375/300 |
| 2008/0057880 A1 | 3/2008 | Copeland | |
| 2008/0123770 A1 | 5/2008 | Copeland | |
| 2010/0027690 A1 * | 2/2010 | Liang et al. | 375/260 |

\* cited by examiner

*Primary Examiner* — Sam K Anh
*Assistant Examiner* — Sophia Vlahos
(74) *Attorney, Agent, or Firm* — John J. Patti; Wade J. Brady, III; Frederick J. Telecky, Jr.

(57) ABSTRACT

A signal processing circuit is configured to calculate a gain ratio to efficiently reduce a peak to average signal ratio for an input signal by identifying signal peaks and determining the signal peak magnitudes. A window function in combination with the gain ratio is applied to a portion of the input stream having a peak signal to create a cancellation pulse to be applied to that peak signal. The cancellation pulse phase is aligned with the signal phase, thereby causing minimal phase distortion in the resultant output signal and accurate peak cancellation. The cancellation pulse can also include a finite impulse response filter portion to efficiently handle wide bandwidth signals. The hardware may be configured to process multiple signal streams in parallel to reduce hardware requirements. An algorithm can determine the effect of multiple corrections to the input stream to avoid overcorrection in the signal processing process.

16 Claims, 5 Drawing Sheets

US 8,265,196 B2

NOISE INJECTION CIRCUIT AND METHOD FOR SIGNAL PROCESSING

TECHNICAL FIELD

This invention relates generally to circuitry for performing signal processing.

BACKGROUND

Various wireless communication systems are known. Higher order modulation wireless signals such as those used in CDMA (Code Division Multiple Access) or OFDM (Orthogonal Frequency Division Multiplexing) based communication systems have a high Peak to Average signal power Ratio (PAR). The higher peaks require the communication system to operate a Power Amplifier (PA) used to transmit the signal at less than an optimal power level because the higher signal peaks can cause the PA to max-out or saturate. To allow the power amplifier for a communication system to be driven harder and more efficiently, the peak to average ratio of the transmitted signals should be reduced while preserving the other characteristics of the signal such as modulation accuracy and spectral mask requirements.

Digital PAR reduction techniques typically involve injecting noise into the signal to cancel out the time domain signal peaks, thereby reducing the PAR. Traditionally, finite impulse response (FIR) filters are used to spectrally shape the cancellation noise before applying the cancellation noise to the signal; one such approach to using an FIR filter to reduce PAR includes that described in U.S. patent application Ser. No. 10/643,179, filed Aug. 18, 2003, published as U.S. 2004/0052314, which is incorporated herein by reference. By so shaping the cancellation noise, spectral re-growth of the signal is prevented. For multi-carrier systems, using an FIR filter, however, causes the phase of the injected noise to be different from the phase of the signal, which introduces phase noise to the transmitted signal. The FIR filter should match the instantaneous spectrum of the composite multicarrier signal typical of transmit systems, otherwise mismatch between the time domain profiles of the signal peaks and the cancellation noise reduces the peak cancellation efficiency.

Moreover, the peak reduction algorithm typically needs to run at high sample rates because higher oversampling enables better fractional peak estimation. These processing requirements make the FIR filter an expensive solution in terms of hardware requirements. Additionally, multi-carrier communication signals requiring dynamic allocation of carrier frequencies, or dynamic scaling of carrier power, require the FIR filter coefficients to also be recomputed and updated on the fly, thereby requiring additional processing resources. In the absence of prior knowledge of the frequency hopping sequence for a communication signal, estimation of the new FIR filter coefficients to match the new carrier frequency allocations becomes a very hardware intensive problem.

SUMMARY

Generally speaking and pursuant to these various embodiments, an example signal processing circuit is configured to calculate a gain ratio to efficiently reduce a peak to average signal ratio for an input signal by identifying signal peaks and determining the signal peak magnitudes. A window function in combination with the gain ratio is applied to a portion of the input stream having a peak signal to create a cancellation pulse to be applied to that peak signal. By such an approach, the cancellation pulse phase is aligned with the signal phase, thereby causing minimal or no phase distortion in the resultant output signal and accurate peak cancellation. By another approach, the cancellation pulse can also include a finite impulse response filter portion to efficiently handle wide bandwidth signals.

In various approaches, the hardware is configured to process two or more data streams in parallel. For example, the hardware may process the initial input stream while at the same time processing for a second time an earlier portion of the input stream to allow for additional peak reduction without additional hardware. In still additional approaches, an algorithm may be applied to determine the effect of multiple corrections to the input stream to avoid overcorrection in the signal processing process.

BRIEF DESCRIPTION OF THE DRAWINGS

The above needs are at least partially met through the provision of the noise injection circuit and method for signal processing described in the following detailed description, particularly when studied in conjunction with the drawings wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION OF THE PREFERRED EMBODIMENT(S)

Figure 1:
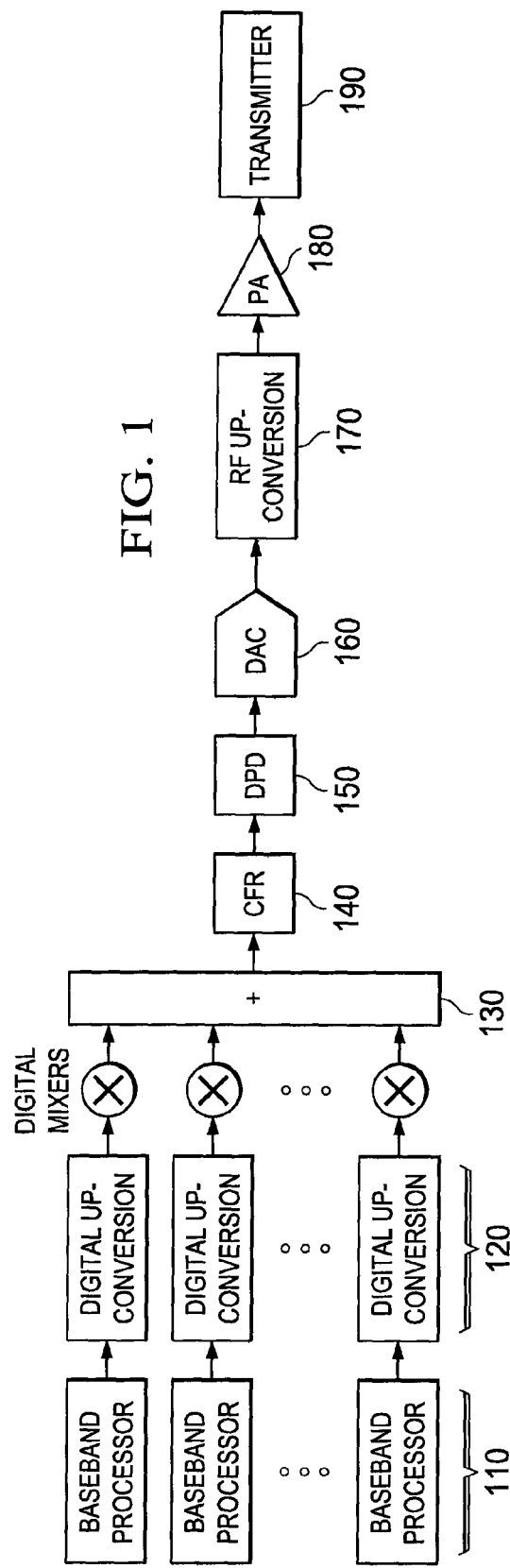
FIG. 1 comprises a block diagram of a signal processing stream for a communication signal.

Referring now to the drawings, and in particular to FIG. 1, a typical signal processing system for processing a communication signal will be described. A plurality of baseband processors 110 each create a digital baseband communication signal. Each baseband signal is passed to a digital up-conversion circuit 120 that converts the digital baseband signal into an over-sampled signal. The over-sampled signals are provided to a digital mixer circuit 130 that combines the over-sampled signals into a single composite input signal. The composite input signal is provided to a crest factor reduction circuit 140 that reduces some of the signal peaks relative to the average power of the input signal. The output of the crest factor reduction circuit 140 is provided to a digital pre-distortion circuit 150. The digital pre-distortion circuit 150 conditions the signal to increase the transmission efficiency of the signal. The digital pre-distorted signal is provided to a digital to analog converter circuit 160. The analog signal provided by the digital to analog converter circuit 150 is provided to an RF up-conversion circuit 170 that adjusts the frequency of the analog signal for transmission. The up-converted analog signal is provided to a power amplifier 180 that amplifies the signal for transmission by a transmitter 190. The transmitter 190 may send the communication signal either wirelessly or through a wired connection.

An example crest factor reduction circuit 140 will be described with reference to FIG. 2. A signal processor circuit 200 is adapted to operate in a window function mode and a window-finite impulse response mode. The signal processor circuit 200 uses cancellation pulse information derived at least in part from a first window function when operating in the window function mode. When operating in the window-finite impulse response mode, the signal processor circuit 200 uses cancellation pulse information derived at least in part from a second window function and at least in part from a finite impulse response filter. An example operation of the circuit under each of these two modes will be described further below.

The signal processor circuit 200 includes a multiplexer 205 adapted to receive an input signal 206 and a processed input signal 207. The multiplexer 205 combines the input signal 206 and the processed input signal 207 so that both signals may be processed at the same time by the described hardware. For instance, a first processor 210 (which generally includes delay 211 and fractional delays 212-214) has two or more processing streams to process information regarding both the input signal 206 and the processed input signal 207. The first processor 210 is adapted to receive the input signal 206 and the processed input signal 207 and is adapted to sample the input signal 206 and the processed input signal 207 at two or more sampling rates to identify signal peaks in the signals. The first processor 210 also determines signal peak location information for the signal peaks identified in the input signal 206 and the processed input signal 207. The signal peak information and signal peak location information is passed to a magnitude determination circuit 215 (which generally includes magnitude circuits 216-219. The magnitude determination circuit 215 is operatively coupled to the first processor 210 to determine magnitude information for the signal peaks. In various approaches, the magnitude determination circuit 215 may comprise a CORDIC circuit or a multiplier circuit, which are known in the art.

The second processor identifies signal peaks in a time range and provides a gain ratio for the signal peaks in the time range. In the example of FIG. 2, the second processor comprises two logic elements 220 and 225 wherein the first logic element 220 identifies signal peaks in the time range and the second logic element 225 provides the gain ratio for the signal peaks in the time range. Those skilled in the art will recognize and understand that such an apparatus 200, including the second processor 220 and 225, may be comprised of a plurality of physically distinct elements as is demonstrated by the illustration shown in FIG. 2. It is also possible, however, to view this illustration as comprising a logical view in which case one or more of these elements can be enabled and realized via a shared platform. It will also be understood that such a shared platform may comprise a wholly or at least partially programmable platform as is known in the art.

A memory circuit 230 is adapted to store and dynamically allocate cancellation pulse information to an input signal stream and to a processed input signal stream for at least one of the window function mode and the window-finite impulse response mode. An assembler 240 is adapted to combine the cancellation pulse information with the input signal and the processed input signal.

Figure 2:
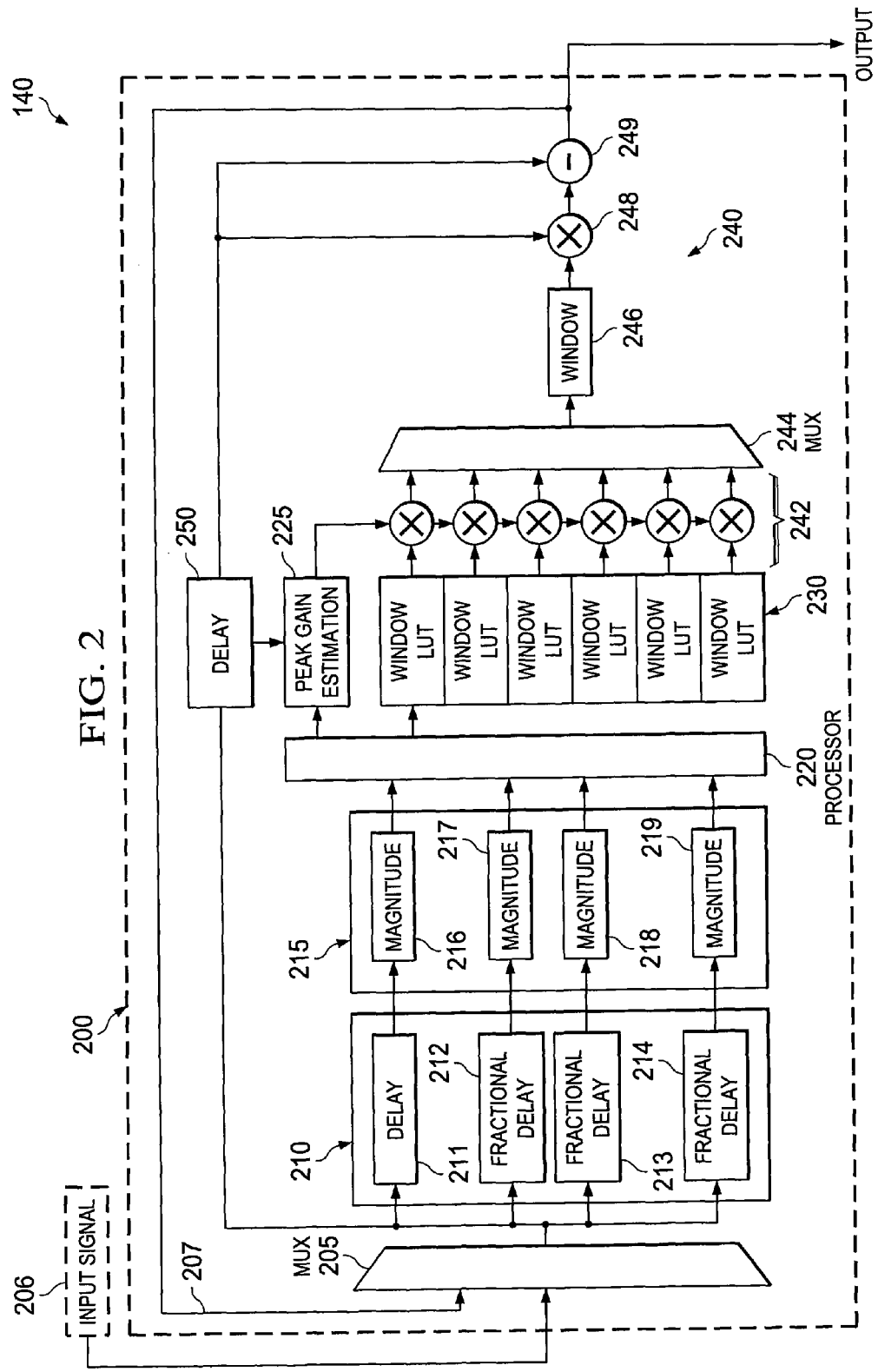
FIG. 2 comprises a block diagram of an example signal processor operating in a window function mode as configured in accordance with various embodiments of the invention.

The signal processor circuit 200 of FIG. 2 shows an example assembler 240 that is adapted to operate in the window function mode. In this example, when operating in the window function mode, the second processor element 225 calculates the gain ratio for the input signal 206 and the processed input signal 207. The gain ratio is provided to the assembler 240. The assembler 240 includes a plurality of multiplier circuits 242 adapted to multiply the gain ratio from the second processor element 225 by look-up table values from the memory 230 related the first window function. These elements are then multiplexed by a multiplexer 244 and provided to a window function circuit 246, which provides the window function shape to the product of the gain ratio and the look-up table values. The information from the window function circuit 246 is provided to another multiplier circuit 248 which multiples this information to the input signal over a time window approximately centered at a signal peak location for a signal peak to create a cancellation pulse for the signal peak when operating in the window function mode. The cancellation pulse provided from the multiplier circuit 248 is then subtracted from the signal having the peak signal at a subtraction circuit 249. The subtraction function combines the shaped noise provided from the cancellation pulse with either the input signal 206 or the processed input signal 207 centered around a signal peak to reduce the height of the signal peak relative to the average signal power. The thus processed signal is provided as the output to the next step in the processing system.

A delay circuit 250 is provided in the signal processor circuit 200 to control the processing timing of the input signal 206 and the processed input signal 207 as the data streams flow through the various elements of the signal processor circuit 200. In this example, the delay circuit 250 receives the input signal 206 and the processed input signal 207 information from the multiplexer 205 and provides those signals to the second processor element 225 and to the assembler 240 at the multiplier circuit 248 and the subtraction circuit 249.

A signal processor circuit 200 with circuitry to operate in a window-finite impulse response mode will be described with reference to FIG. 3. In this example, the memory circuit 230 includes look-up table values related to both a window function and a finite impulse response mode filter. When the signal processor circuit 200 operates in the window-finite impulse response mode, the second processor element 225 calculates a first gain ratio and a second gain ratio for the input signal 206 and the processed input signal 207. The assembler 240 in this example comprises a multiplier circuit 242 adapted to multiply the first gain ratio from the second processor element 225 by look-up table values from the memory circuit 230 related to the second window function. This information is provided to the multiplexer circuit 244 that combines the information and provides it to the window function circuit 246. Information from the window function circuit 246 is then provided to a multiplier circuit 248 to multiply the information by the input signal 206 over a time window approximately centered at the signal peak location for a signal peak to create a window-function-cancellation pulse portion. In parallel to this process, the multiplier circuit 242 of the assembler 240 multiples a second gain ratio from the second processor circuit 225 by finite impulse response look-up table values from the memory 230 related to a finite impulse response filter to create a finite-impulse-response-cancellation pulse portion. The assembler 240 includes an addition circuit 251 adapted to add the window-function-cancellation pulse portion to the finite-impulse-response-cancellation pulse portion to create the cancellation pulse. The cancellation pulse is then subtracted by subtracting circuit 249 from the input signal or the processed input signal 207.

Figure 3:
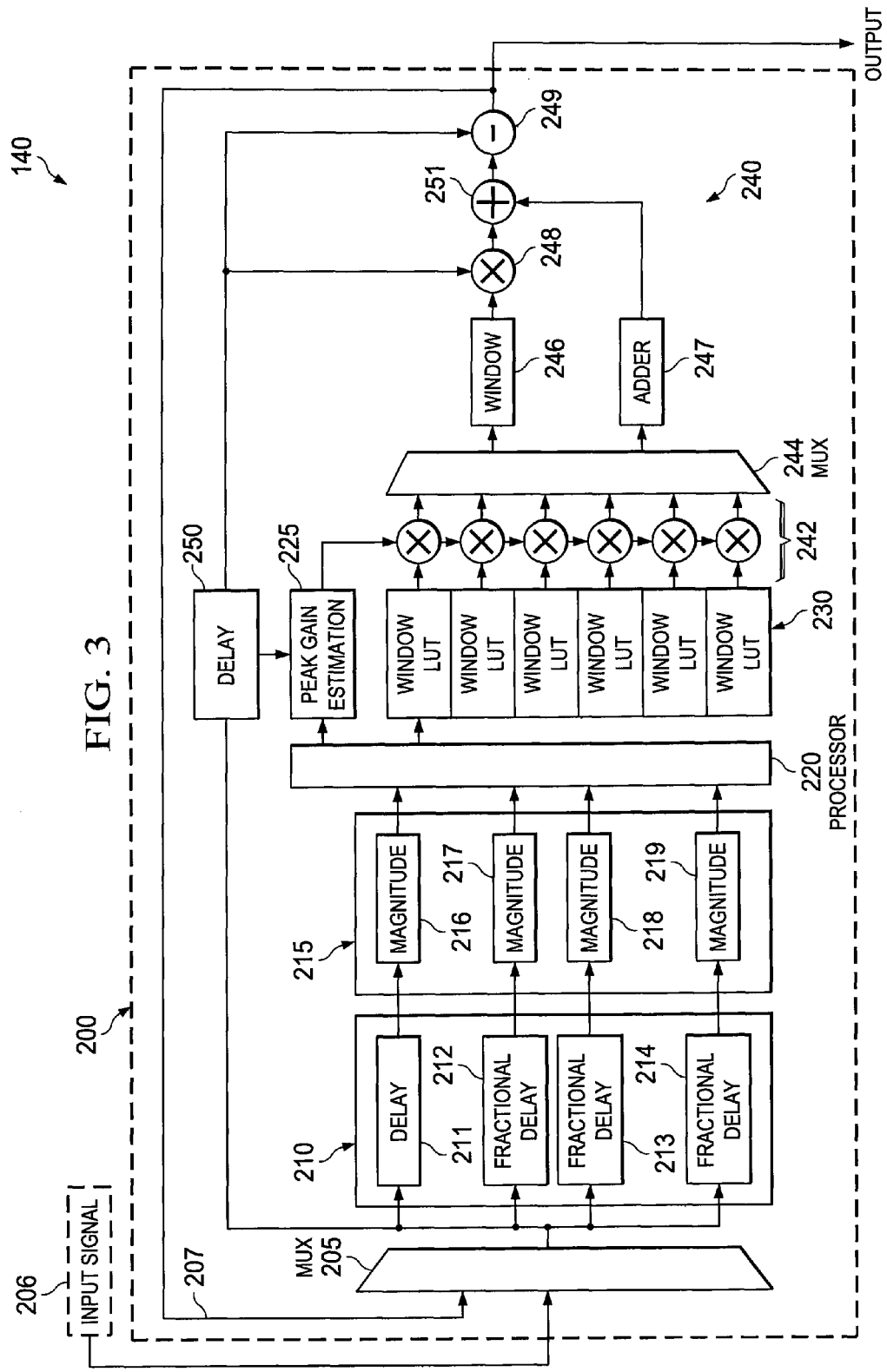
FIG. 3 comprises a block diagram of an example signal processor capable of operating in various modes as configured in accordance with various embodiments of the invention.

The example signal processor circuit 200 of FIG. 3 may operate in either a window function mode or a window-finite impulse response mode. When operating in the window-finite impulse response mode, all of the circuits as described above are in use. When operating in the window function mode, however, the adder circuit 247 and addition circuit 251 are disabled and the memory circuit 230 only provides information regarding the window function. Accordingly, the circuit of FIG. 3 may operate in a window function mode by simply passing the cancellation pulse information from the multiplier circuit 248 straight through the subtraction circuit 249 for application to the input signal or the processed input signal. The circuit of FIG. 3 may also operate in solely a finite impulse response mode as known in the art by disabling the window function circuit 246 and multiplier 248. Accordingly, the signal processing circuit 200 may be operated in a window function mode, a window-finite impulse response mode, or a finite impulse response mode using the same hardware. The signal processing circuit 200 mode may be controlled by a separate controller circuit operating the communication system.

Figure 4:
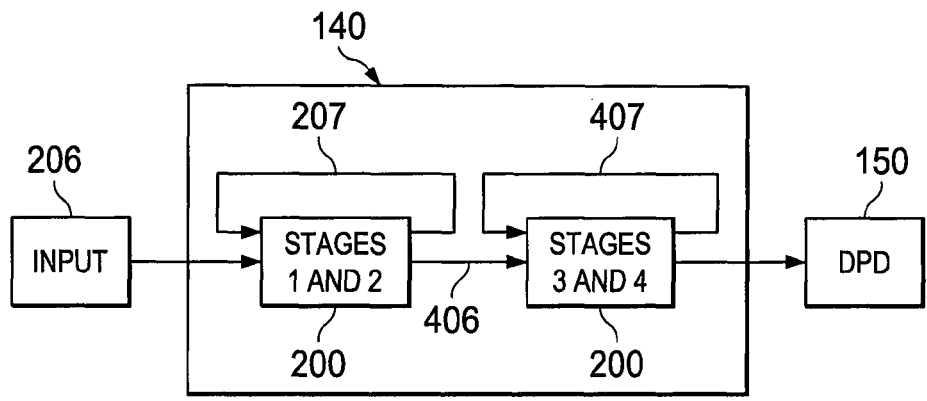
FIG. 4 comprises a block diagram of an example multi-stage signal processor as configured in accordance with various embodiments of the invention.

With reference to FIG. 4, the hardware for a signal processor circuit 200 may be used multiple times to reduce the amount of hardware used in a signal processing system. For example, the input signal 206 coming into an example crest reduction factor circuit 140 will be processed in a first stage by circuits such as that of FIG. 2 or FIG. 3. After being processed in the first stage, the processed input signal 207 is re-circulated through the same hardware to be reprocessed in a second stage thereby reducing additional signal peaks that still exist in a processed input signal. After the processed input signal 207 has been re-processed by the signal processor circuit 200 at the second stage, this doubly processed signal 406 may be provided to a second signal processor circuit 200. The signal 406 is then processed at a third stage as described herein to reduce additional signal peaks. After the third stage, the thrice processed signal 407 may be resent through the second signal processor circuit 200. This signal 407 is then processed for a fourth time at stage four. Accordingly, an input signal 206 can be processed four times to reduce multiple peak signals while using a reduced amount of hardware. Modifications to this multi-stage processing process can be made to match the requirements of a particular system.

Figure 5:
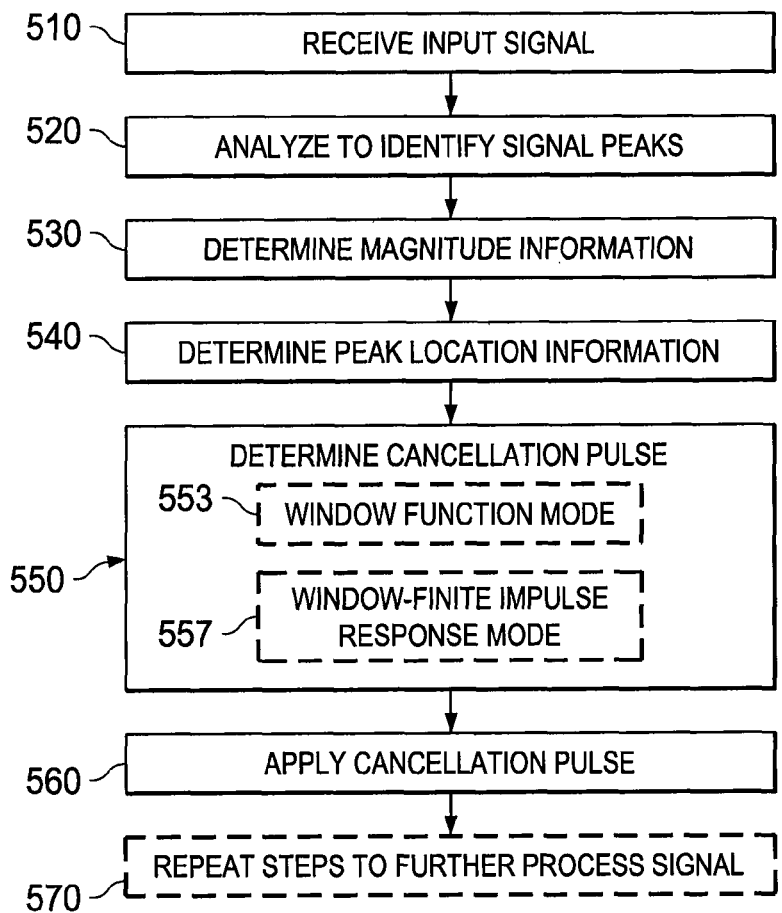
FIG. 5 comprises a flow diagram of an example signal processing method for reducing peak to average signal ratios as configured in accordance with various embodiments of the invention.

A method of operation of a signal processor circuit will be described with reference to FIG. 5. A method of performing signal processing to reduce a peak to average signal ratio for a signal includes at step 510 receiving an input signal and at step 520 analyzing the input signal to identify signal peaks in the input signal over a time range. At step 530 the method includes determining magnitude information for at least one signal peak in the time range. For example, this step may include determining a power for signal peaks in the time range identified by the steps above. At step 540 the method includes determining fractional signal peak location information for at least one signal peak in the time range.

At step 550 the method includes determining a cancellation pulse wherein the cancellation pulse is based at least in part on the input signal, the magnitude information, the signal peak location information, and a window function approximately centered using the signal peak location information. The cancellation pulse is determined in different ways depending on the function or mode of operation of the signal processing circuit.

When operating in a window function mode 553, the step of determining the cancellation pulse includes multiplying a gain ratio, the input signal, and look-up table values for the window function with the window function approximately centered at a signal peak of the input signal together to generate the cancellation pulse. In one example of this mode, there is a pre-stored window lookup table (LUT) with unity center tap, in other words, with a peak at the center of the window function. When a signal peak is detected, the cancellation pulse is obtained by windowing the processed signal itself around the peak location.

The following equations further describe an example method of creating the cancellation pulse in the window function mode. In this example, the gain ratio comprises one minus a total comprising a target signal level (targetTH) divided by a square root of power for the signal peak (peakPwr):

$$\text{ratio} = 1 - \frac{targetTH}{\sqrt{peakPwr}}$$

$$winGain = \text{ratio}$$

The ratio (noted as "winGain") is then multiplied by the lookup table values for the window function ($LUT_{WIN}$) over the size of the lookup table ($N_{lutsize}$) and by the input signal itself centered over the target peak to be reduced (Input ($N_{peakLoc}+k-N_{centerTap}$)):

$$CP(N_{peakLoc}+k-N_{centerTap}) = winGain \times LUT_{WIN}(k) \times \text{Input}(N_{peakLoc}+k-N_{centerTap})$$

where $k=0, \ldots, N_{lutsize}-1$. Here, $LUT_{WIN}$ is the coefficient array of the window LUT, targetTH is the preferred signal level, and peakPwr and peakVal are the corresponding power and value or location of the peak after up-sampling. The signal peak power and location variables are calculated in the above example by the magnitude determination circuit 210 and second processor element 220 respectively during peak detection logic processing. The gain ratio is calculated by the second processor element 225.

Accordingly, in the window function mode, the cancellation pulse is generated by placing a window to the processed signal around the peak to be reduced. So configured, one window can be used for the span of the cancellation pulse. In addition, the input signal phase is maintained, and for hopping signals, there is no need to re-generate a new base cancellation pulse for every new frequency allocation as is required when peak reduction is performed using a finite impulse response mode. The window function mode achieves good performance, for example, for MCGSM (Multi-Carrier Global System for Mobile communication) signals.

With reference again to FIG. 5, the determination of the cancellation pulse when operating in a window-finite impulse response mode 557 includes multiplying a first gain ratio, the input signal, and look-up table values for the window function to create a window-function-cancellation pulse portion. The cancellation pulse determination includes multiplying a second gain ratio by finite impulse response look-up table values to create a finite impulse response cancellation pulse portion. The window-function-cancellation pulse portion is added to the finite-impulse-response-cancellation pulse portion to create the cancellation pulse when operating in the window-finite impulse response mode.

In one example of this mode, there is one pre-stored window function lookup table and one pre-stored finite impulse response filter lookup table, both with unity center tap. The pre-stored cancellation pulse contains a designed noise shape, which can be concentrated around direct current (DC) or several frequency locations. When a peak is detected, the portion of the peak outside of a target signal level is cancelled in two ways. Half of the peak will be cancelled through a windowing approach such as that described above; the other half will be cancelled through a finite impulse response filter approach.

In this example, the first gain ratio (winGain) comprises a fraction of a value comprising one minus a total comprising a target signal level divided by a square root of a peak power for the signal peak. The first gain ratio is used with the window function portion of the cancellation pulse. The second gain ratio (firGain) comprises a fraction of a peak power for the signal peak multiplied by a value comprising a target signal level divided by a square root of the peak power for the signal peak. The second gain ratio is used with the FIR filter portion of the cancellation pulse. The gain ratios are described in the following equations:

$$\text{ratio} = 1 - \frac{targetTH}{\sqrt{peakPwr}};$$

$$firGain = \text{ratio} \times peakVal/2;$$

$$winGain = \text{ratio}/2;$$

The cancellation pulse in the window-finite impulse response mode is then created by adding the two portions as described in the following equation:

$$CP(N_{peakLoc} + k - N_{centerTap}) = firGain \times LUT_{FIR}(k) + winGain \times LUT_{WIN}(k) \times \text{Input}(N_{peakLoc} + k - N_{centerTap})$$

where k=0, ..., $N_{lutsize}$−1. Again, targetTH is the preferred signal level, and peakPwr and peakVal are the corresponding power and value of the peak after interpolation. $LUT_{FIR}$ (k) are the lookup table values for the finite impulse response filter, which are calculated as known in the art.

In this approach, more than average clipping noise is provided in certain frequency areas. Such an approach can be helpful, for example, in an Orthogonal Frequency Division Multiplexing (OFDM) system where a guard band between two neighboring channels has some extra margin on spectral mask requirements.

After the cancellation pulse is determined, the method at step 560 includes applying a cancellation pulse to the input signal. By one approach, the method may further include repeating the method a predetermined number of times to reduce a plurality of signal peaks in the input signal at step 570. For example, a processed input signal may be re-circulated through the same hardware to process the signal for second time to reduce signal peaks that were not processed during the first processing of the input signal, to reduce residual peaks not fully reduced by application of a cancellation pulse, and/or to reduce peaks that are created through the application of the noise signal to the input signal during cancellation.

Figure 6:
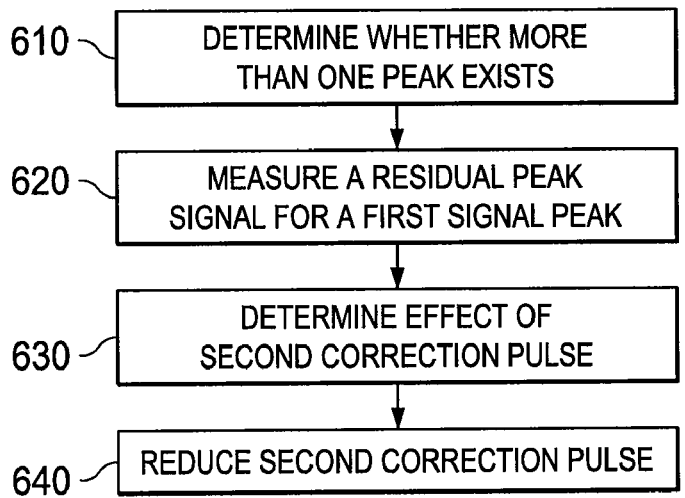
FIG. 6 comprises a flow diagram of an example signal processing method for reducing overcorrection of a peak signal as configured in accordance with various embodiments of the invention.

With reference to FIG. 6, a method of controlling overcorrection in a signal processor will be described. An input signal is processed to identify peaks of the input signal to which to apply correction pulse. Then at step 610 the method includes determining whether more than one peak exists in a time window of the input signal. At step 620, the method includes measuring a residual peak signal for a first single peak to which the correction pulse is to be applied. In other words, this step determines how much of the original peak signal will be left after the cancellation pulse is applied. At step 630 the method includes determining whether a second correction pulse to be applied to a second peak in the time window is larger at the first signal peak location then the residual peak signal. In this step consideration is given to the width over which a cancellation pulse is applied to the input signal. For instance, more than one signal peak may fall within one time window or width of a cancellation pulse. Accordingly, a cancellation pulse applied to one peak may also significantly reduce other peaks within the time window. If a second peak is so reduced after already being reduced by a cancellation peak applied to the second peak, the second peak may be completely erased.

Figure 7:
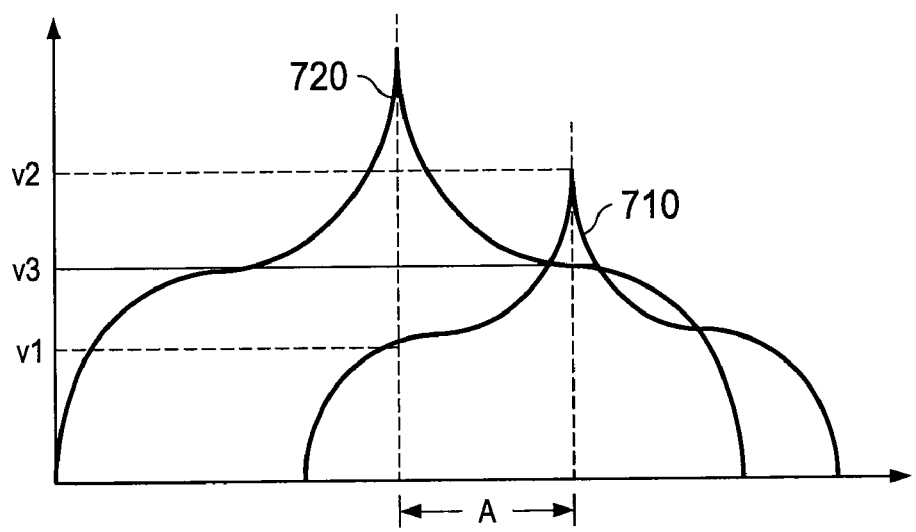
FIG. 7 comprises a graph showing two peak signals in relatively close proximity.

For example, FIG. 7 shows a first signal peak 710 and a second signal peak 720 separated by a time distance A. The time distance A is shorter than one half of the width of a window function used to shape a cancellation pulse applied to the signal peaks. When the first peak 710 is detected by the circuit, a cancellation pulse will be applied to reduce the first signal peak 710. A residual peak will likely remain after the application of the cancellation pulse, wherein the residual peak maintains a peak power higher than a target power as discussed above. When the circuit detects the second peak 720, a second cancellation pulse will be applied to reduce the second peak 720. The second cancellation pulse will also affect the residual signal peak at the first signal peak location 710 if the cancellation pulse applied to the second peak 720 is wide enough to capture the first signal peak location 710. If the second cancellation pulse is larger at the first signal peak location 710 than the residual peak at the first location 710, then the residual peak will be reduced below the target signal peak, thereby overcorrecting the first signal peak 710.

When this occurs, with reference again to FIG. 6, the method includes at step 640 reducing the second correction pulse by a factor relating to the residual peak signal when the second correction pulse to be applied to the second peak in the time window is larger at the first signal peak location than the residual peak signal. In one example, this step 640 may include reducing the second correction pulse such that the second correction pulse's magnitude is approximately the same as or less than the residual peak signal's magnitude. This same process can be applied to determine the effect the cancellation pulse applied to the first signal peak 710 will have on the second signal peak 720, and the cancellation pulses applied to both peaks may be adjusted accordingly.

In one approach, the method described in reference to FIG. 6 is performed by the second processor element 220. In this approach, the second processor element 220 is adapted to receive an input signal data stream and a processed input signal stream from the first processor 215 and includes logic such that the second processor performs a signal processing method substantially according to that described in reference to FIG. 6.

So configured, a signal processor that processes a communication signal to reduce signal peaks in order to reduce a PAR may be controlled to reduce the likelihood of overcorrection caused by correcting multiple signal peaks in a short time window.

Those skilled in the art will recognize that a wide variety of modifications, alterations, and combinations can be made with respect to the above described embodiment without departing from the scope of the invention. For example, although the signal processing circuit it described herein as processing two signal streams, such a circuit may be modified to process one or more streams. Such modifications, alterations, and combinations are to be viewed as being within the ambit of the inventive concept.

What is claimed is:

1. A method of performing signal processing to reduce a peak to average signal ratio for a signal, the method comprising:
   receiving an input signal;
   using a signal processor circuit analyzing the input signal to identify signal peaks in the input signal over a time range;
   determining magnitude information for at least one signal peak in the time range;
   determining fractional signal peak location information for the at least one signal peak in the time range;
   determining a cancellation pulse, wherein the cancellation pulse is based at least in part on the input signal, the magnitude information, the signal peak location information, and a window function that is approximately centered at using the signal peak location information by:
      multiplying a first gain ratio, lookup table values for the window function, and the input signal to create a window-function-cancellation pulse portion;
      multiplying a second gain ratio by finite impulse response lookup table values to create a finite-impulse-response-cancellation pulse portion; and
      adding the window-function-cancellation pulse portion and the finite-impulse-response-cancellation pulse portion; and
   applying the cancellation pulse to the input signal.

2. The method of claim 1, wherein the step of determining magnitude information for the at least one signal peak in the time range further comprises determining a power for signal peaks in the time range.

3. The method of claim 1, wherein at least one of the first and second gain ratios comprises one minus a total comprising a target signal level divided by a square root of power for the signal peak.

4. The method of claim 1, wherein the first gain ratio comprises a fraction of a value comprising one minus a total comprising a target signal level divided by a square root of a peak power for the signal peak.

5. The method of claim 1, wherein the second gain ratio comprises a fraction of a peak power for the signal peak multiplied by a value comprising a target signal level divided by a square root of the peak power for the signal peak.

6. The method of claim 1, wherein the method further comprises repeating the method a predetermined number of times to reduce a plurality of signal peaks in the input signal.

7. The method of claim 1, wherein the method further comprises:
   determining whether more than one peak exists in a time window for the input signal;
   measuring a residual peak signal at a first signal peak location for a first signal peak to which the correction pulse is to be applied;
   determining whether a second correction pulse to be applied to a second peak in the time window is larger at the first signal peak location than the residual peak signal;
   reducing the second correction pulse by a factor relating to the residual peak signal when the second correction pulse to be applied to the second peak in the time window is larger at the first signal peak location than the residual peak signal.

8. A signal processor circuit adapted to operate in a window function mode and a window-finite impulse response mode, the signal processor circuit comprising:
   a multiplexer adapted to receive an input signal and a processed input signal;
   a first processor having two or more processing streams, wherein the first processor is adapted to receive the input signal or the processed input signal, and wherein the first processor is adapted to sample the input signal or the processed input signal at two or more sampling rates to identify signal peaks, and wherein the first processor determines signal peak location information for the signal peaks;
   a magnitude determination circuit operatively coupled to the first processor to determine magnitude information for the signal peaks;
   a second processor that identifies the signal peaks in a time range and provides a gain ratio for the signal peaks in the time range, wherein the signal processor circuit uses cancellation pulse information derived at least in part from a first window function when operating in the window function mode, and wherein the signal processor circuit uses cancellation pulse information derived at least in part from a second window function and at least in part from a finite impulse response filter when operating in the window-finite impulse response mode;
   a memory circuit adapted to store and dynamically allocate the cancellation pulse information to the input signal or the processed input signal for at least one of the window function mode and the window-finite impulse response mode; and
   an assembler that is adapted to combine the cancellation pulse information with the input signal or the processed input signal.

9. The signal processor circuit of claim 8, wherein the magnitude determination circuit comprises a CORDIC circuit or a multiplier circuit.

10. The signal processor circuit of claim 8, wherein the second processor calculates a gain ratio for the input signal or the processed input signal; and wherein the assembler comprises multiplier circuits adapted to multiply the gain ratio, lookup table values related to the first window function, and the input signal over a time window approximately centered at a signal peak location for a signal peak to create a cancellation pulse for the signal peak when operating in the window function mode.

11. The signal processor circuit of claim 10, wherein the gain ratio comprises one minus a total comprising a target signal level divided by a square root of a peak power for the signal peak.

12. The signal processor circuit of claim 10, wherein the lookup table values comprise window function values in a time domain over the time window with the window function values approximately centered at the signal peak location for the signal peak.

13. The signal processor circuit of claim 8,
wherein when operating in the window-finite impulse response mode, the second processor calculates a first gain ratio and a second gain ratio for the input signal or the processed input signal; and
wherein the assembler comprises a multiplier circuit adapted to:
multiply the first gain ratio, lookup table values related to the second window function, and the input signal over a time window approximately centered at the signal peak location for a signal peak to create a window-function-cancellation pulse portion; and
multiply the second gain ratio to finite impulse response lookup table values related to the finite impulse response filter to create a finite-impulse-response-cancellation pulse portion;
and wherein the assembler comprises an addition circuit adapted to add the window-function-cancellation pulse portion to the finite-impulse-response-cancellation pulse portion to create the cancellation pulse.

14. The signal processor circuit of claim 13, wherein the first gain ratio comprises a fraction of a value comprising one minus a total comprising a target signal level divided by a square root of a peak power for the signal peak.

15. The signal processor circuit of claim 13, wherein the second gain ratio comprises a fraction of a peak power for a signal peak multiplied by a value comprising a target signal level divided by a square root of the peak power for the signal peak.

16. The signal processor circuit of claim 8, wherein the second processor is further adapted to receive the input signal or the processed input signal from the first processor and includes logic such that the second processor performs a signal processing method comprising:
determine whether more than one signal peak exists in a time window of the input signal;
measure a residual peak signal for a first signal peak to which a correction pulse is to be applied;
determine whether a second correction pulse to be applied to a second peak in the time window is larger at the first signal peak location than the residual peak signal;
reduce the second correction pulse by a factor relating to the residual peak signal when the second correction pulse to be applied to the second peak in the time window is larger at the first signal peak location than the residual peak signal.

\* \* \* \* \*